(12) United States Patent
Koike et al.

(10) Patent No.: US 6,171,672 B1
(45) Date of Patent: Jan. 9, 2001

(54) COVER TAPE FOR CHIP TRANSPORTATION AND SEALED STRUCTURE

(75) Inventors: Hiroshi Koike, Urawa; Katsuhisa Taguchi, Koshigaya; Kazuyoshi Ebe, Saitama, all of (JP)

(73) Assignee: Lintec Corp. (JP)

( * ) Notice: Under 35 U.S.C. 154(b), the term of this patent shall be extended for 0 days.

(21) Appl. No.: 09/201,383

(22) Filed: Nov. 30, 1998

(30) Foreign Application Priority Data

Dec. 1, 1997 (JP) .................................................... 9-329900

(51) Int. Cl.[7] ...................................................... C09J 7/02
(52) U.S. Cl. ...................... 428/40.1; 428/41.8; 428/42.2; 428/42.3; 428/352
(58) Field of Search ................................ 428/40.1, 41.1, 428/41.8, 41.4, 42.2, 42.3, 352

(56) References Cited

U.S. PATENT DOCUMENTS 6,027,802 * 2/2000 Lin ........................................ 428/343

FOREIGN PATENT DOCUMENTS 0501068 9/1992 (EP) .
2500879 5/1996 (JP) .

* cited by examiner

Primary Examiner—Terrel Morris
Assistant Examiner—Arti R. Singh
(74) Attorney, Agent, or Firm—Webb Ziesenheim Logsdon Orkin & Hanson, P.C.

(57) ABSTRACT

A cover tape for chip transportation stuck to a surface of a carrier tape which has parts for accommodating chips formed intermittently in its lengthwise direction, to thereby seal the chip accommodating parts, wherein said cover tape comprises a tape-shaped substrate and pressure sensitive adhesive parts superimposed on one side of the tape-shaped substrate so that the pressure sensitive adhesive parts do not face the chip accommodating parts, the above pressure sensitive adhesive parts comprising a silicone pressure sensitive adhesive and a crosslinking agent (C) capable of crosslinking therewith, the above silicone pressure sensitive adhesive comprising:

(A) a silicone resin component and
(B) a silicone rubber component which contains a phenyl group. This cover tape for chip transportation enables avoiding a lifting/separation of cover tape from carrier tape caused by a difference in thermal shrinkage ratio when a polystyrene carrier tape is used.

8 Claims, 3 Drawing Sheets

COVER TAPE FOR CHIP TRANSPORTATION AND SEALED STRUCTURE

FIELD OF THE INVENTION

The present invention relates to a cover tape for sealing a carrier tape which is employed to individually pack small items (hereinafter also referred to as "chips") such as small electronic parts without causing them to contact each other and hence used in the storage, transportation and automatic takeout of the chips. Moreover, the present invention relates to a sealed structure in which use is made of the above cover tape.

BACKGROUND OF THE INVENTION

In recent years, the movement toward miniaturizing electronic parts such as resistors, capacitors and integrated circuits into chips is rapid. Accordingly, various methods which enable simultaneously carrying out the storage, transportation and automatic takeout of chips have been proposed, of which the tape carrier method is regarded as being the most promising.

The conventional tape carrier method is classified into the method in which a substrate furnished with through holes is used as the carrier tape and the method in which a substrate furnished with recessed parts is used as the carrier tape.

In the method in which use is made of a carrier tape furnished with through holes, a carrier tape composed of, for example, a thick strip of paper is furnished with a multiplicity of through holes at given intervals by punching or other means to thereby provide accommodating parts. Separately, the carrier tape is furnished with a multiplicity of feeding holes. A bottom tape is stuck to one side surface of the carrier tape, and small electronic parts or other chips are accommodated in the accommodating parts. Thereafter, the other side surface of the carrier tape is laminated with a cover tape so that the chips are sealed in the accommodating parts.

In the method in which a substrate furnished with recessed parts is employed as the carrier tape, use is made of a carrier tape produced by furnishing a stripform plastic tape with a multiplicity of recessed parts at given intervals to thereby provide accommodating parts and further furnishing the stripform plastic tape with a multiplicity of feeding holes. Small electronic parts or other chips are accommodated in the accommodating parts, and, thereafter, the carrier tape is laminated with a cover tape so that the chips are sealed in the accommodating parts.

In both the above methods, use is made of the cover tape. A tape comprising a tape-shaped substrate and adhesive layers disposed at both edges along the lengthwise direction on one side of the tape-shaped substrate is used as the above cover tape. The tape-shaped substrate is composed of, for example, polyethylene terephthalate, polyethylene, polypropylene, polystyrene, polyvinyl chloride, a nylon or an ionomer. The conventional general-purpose acrylic, polyester or rubber pressure sensitive adhesive is used as the above adhesive. On the other hand, the carrier tape furnished with recessed parts is composed of, for example, polystyrene, a polycarbonate, polyvinyl chloride or an amorphous polyethylene terephthalate.

However, the use of the above conventional cover tape and carrier tape encounters the problems that the lifting and separation (wrinkle) of the cover tape from the carrier tape occurs during the transportation thereof, depending on the circumstance experienced during the transportation and that the peeling of the cover tape from the carrier tape after the transportation causes adhesive transfer (adhesive residue) onto the carrier tape side.

Illustratively, the cover tape and carrier tape may be exposed to high temperatures such as 50° C. or above, occasionally, 70° C. or above during the transportation in the summer or on the sea. In this high temperature atmosphere, the polystyrene tape generally used as the carrier tape shrinks by about 2%. On the other hand, the shrinkage ratio of polyethylene terephthalate generally employed as a substrate of cover tape is 0.1% or less, so that a shrinkage ratio difference occurs between the cover tape and the carrier tape. Therefore, the cover tape is in excess and the cover tape is lifted from the carrier tape so that the cover tape and the carrier tape are separated from each other.

The above problem would be solved by increasing the bonding strength of the adhesive layer of the cover tape. However, the increase of the bonding strength invites the problem that adhesive residue occurs on the carrier tape when use is made of a carrier tape with relatively high polarity, such as a polycarbonate, polyvinyl chloride or an amorphous polyethylene terephthalate. When the adhesive remains on the carrier tape, conveyance failure occurs at the time of chip mounting, and the adhesive sticks to the takeup machine to thereby disenable smooth winding operation at the time of winding the carrier tape after use. Further, there is the disadvantage that the carrier tape cannot be recycled.

The inventors have conducted extensive and intensive studies with a view toward solving the above problems. As a result, it has been found that the above problems can be solved by employing a specified silicone pressure sensitive adhesive to constitute the adhesive layer of the cover tape. The present invention has been completed on the basis of this finding.

Japanese Patent No. 2,500,879 discloses a cover tape using a silicone pressure sensitive adhesive. However, the patent does not disclose the silicone pressure sensitive adhesive containing a phenyl group as required in the present invention.

Further, when the polydimethylsiloxane pressure sensitive adhesive described in Japanese Patent No. 2,500,879 is used on the cover tape, it has been inevitable to apply an expensive release agent such as a fluorosiloxane release agent to the cover tape. If the ordinary release agent is used, large unwinding force is required at the time of sealing the same to the carrier tape to thereby increase the load on the sealing apparatus.

The present invention has been made taking the above prior art into account. An object of the present invention is to avoid the lifting/separation of the cover tape from the carrier tape which is caused by a difference in thermal shrinkage ratio when a polystyrene carrier tape is used. Another object of the present invention is to avoid the adhesive residue occurring on the carrier tape when a carrier tape with relatively high polarity, such as a polycarbonate, a polyvinyl chloride or an amorphous polyethylene terephthalate tape is used. A further object of the present invention is to ensure small unwinding force, irrespective of the type of release agent employed, so that the load on sealing apparatus is reduced and sealing operation can be efficiently performed.

SUMMARY OF THE INVENTION

The cover tape for chip transportation according to the present invention is one stuck to a surface of a carrier tape which has parts for accommodating chips formed intermittently in its lengthwise direction, to thereby seal the chip accommodating parts, wherein said cover tape comprises a tape-shaped substrate and pressure sensitive adhesive parts superimposed on one surface of the tape-shaped substrate so that the pressure sensitive adhesive parts do not face the chip accommodating parts, the above pressure sensitive adhesive parts comprising a silicone pressure sensitive adhesive and a crosslinking agent (C) capable of crosslinking therewith, the above silicone pressure sensitive adhesive comprising:

(A) a silicone resin component and (B) a silicone rubber component with a structure represented by the formula:

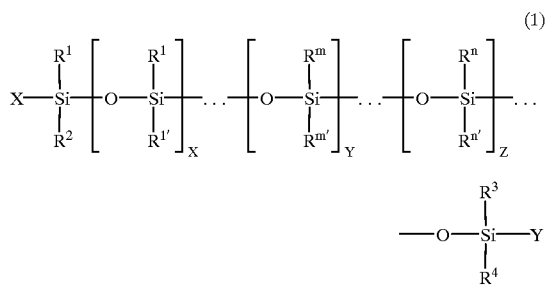

wherein $R^1$, $R^2$, $R^3$ and $R^4$ may be identical with or different from each other and represent a methyl group, an ethyl group or a propyl group;

either of X and Y represents a hydroxyl group and the other represents a hydroxyl group, hydrogen or an alkyl group having 1 to 13 carbon atoms;

each of $R^1$, $R^m$, $R^n$, $R^{1'}$, $R^{m'}$ and $R^{n'}$ independently represents a phenyl group, an alkyl group having 1 to 13 carbon atoms, $CF_3CH_2CH_2$— or a vinyl group, provided that at least one of $R^1$, $R^m$, $R^n$, $R^{1'}$, $R^{m'}$ and $R^{n'}$ is a phenyl group which is present in a ratio of 1 to 30 mol % per 100 mol % of the sum of $R^1$, $R^m$, $R^n$, $R^{1'}$, $R^{m'}$ and $R^{n'}$; and each of x, y and z independently is an integer of 1 to 10.

In the present invention, it is preferred that the pressure sensitive adhesive parts exhibit a probe tack energy value of $2.0 \times 10^{-3}$ to $1.0 \times 10^{-1}$ N·m.

Further, in the cover tape for chip transportation according to the present invention, it is preferred that a substrate surface not furnished with the pressure sensitive adhesive parts be furnished with a release agent layer.

The sealed structure of the present invention comprises:

a carrier tape having a plurality of parts for accommodating chips formed intermittently in its lengthwise direction, a plurality of chips accommodated in the chip accommodating parts, and a cover tape for chip transportation capable of sealing the chip accommodating parts, wherein, this cover tape for chip transportation being the above cover tape for chip transportation according to the present invention.

The present invention described above enables avoiding the separation of the cover tape from the carrier tape which is caused by a difference in thermal shrinkage ratio when a polystyrene carrier tape is used. Further, it enables avoiding the adhesive residue occurring on the carrier tape when a carrier tape with relatively high polarity, such as a polycarbonate, a polyvinyl chloride or an amorphous polyethylene terephthalate tape is used. Still further, it enables ensuring small unwinding force, irrespective of the type of release agent employed, so that the load on sealing apparatus is reduced and sealing operation can be efficiently performed.

DETAILED DESCRIPTION OF THE INVENTION

Figure 1:
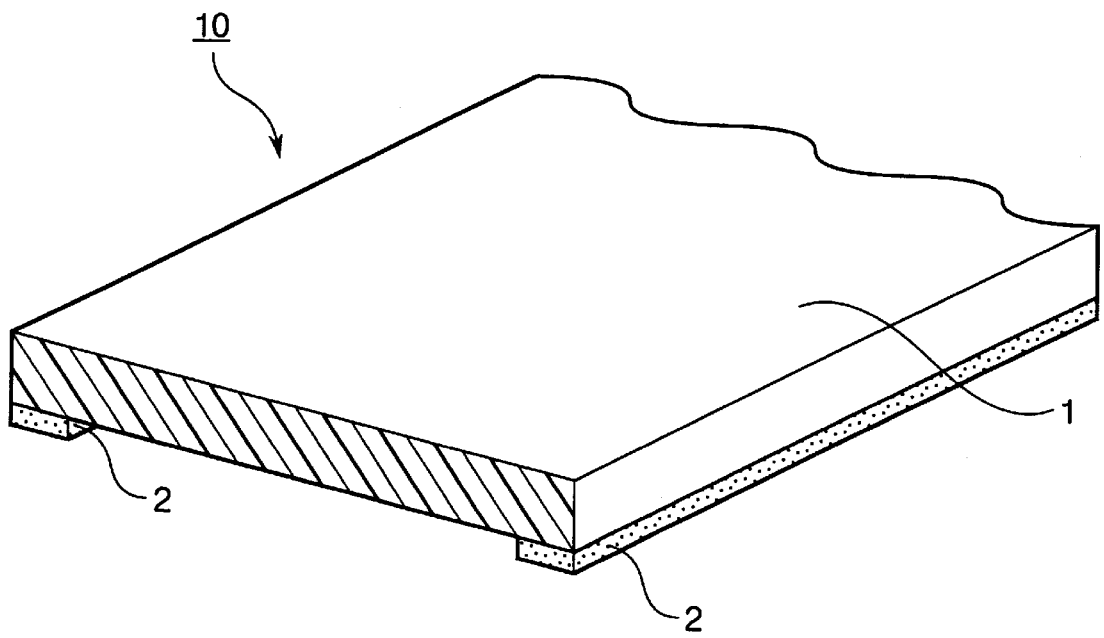
FIGS. 1 to 3 are partial sectional perspective views of cover tapes for chip transportation according to the present invention.

The cover tape for chip transportation according to the present invention will be described in detail below with reference to embodiments shown in the drawings. The cover tape for chip transportation according to the present invention is stuck to a surface of a carrier tape, this carrier tape having parts for accommodating chips formed intermittently in its lengthwise direction, to thereby use it for sealing the chip accommodating parts.

Figure 2:
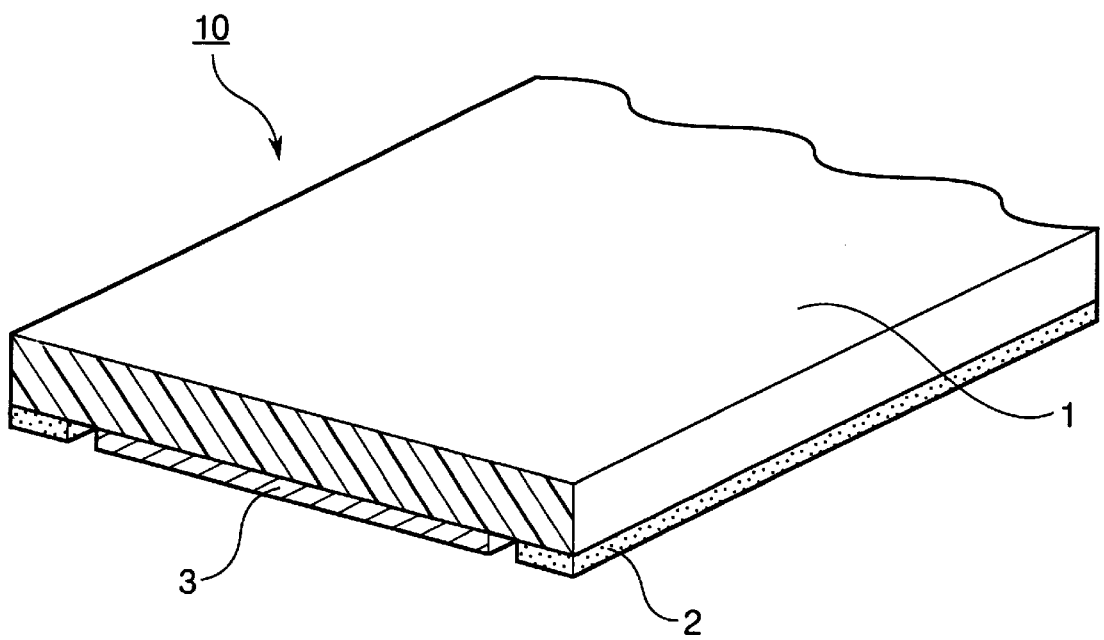
Figure 3:
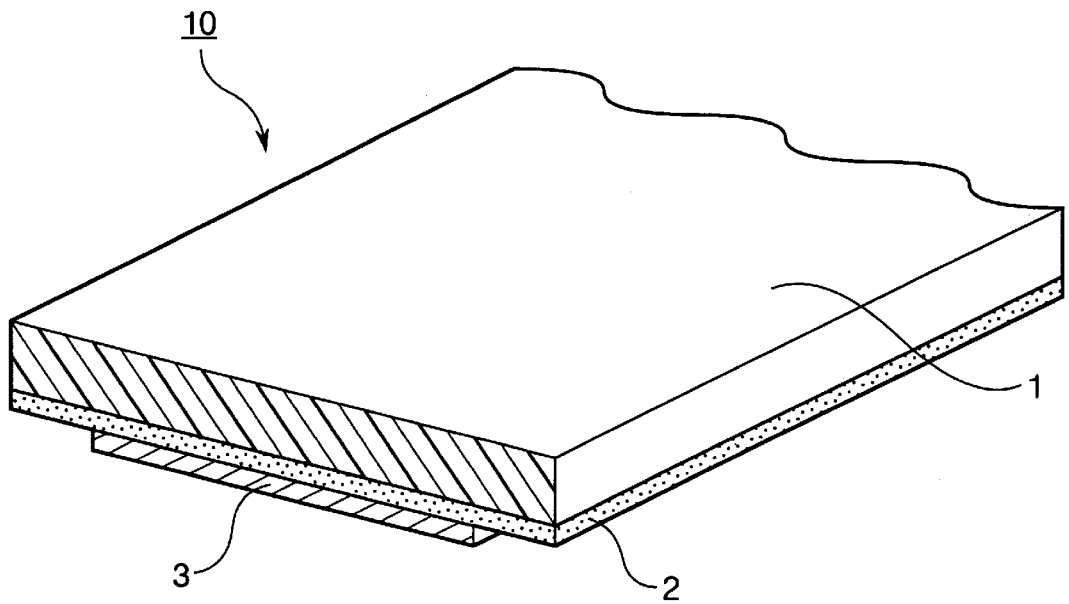
Figure 4:
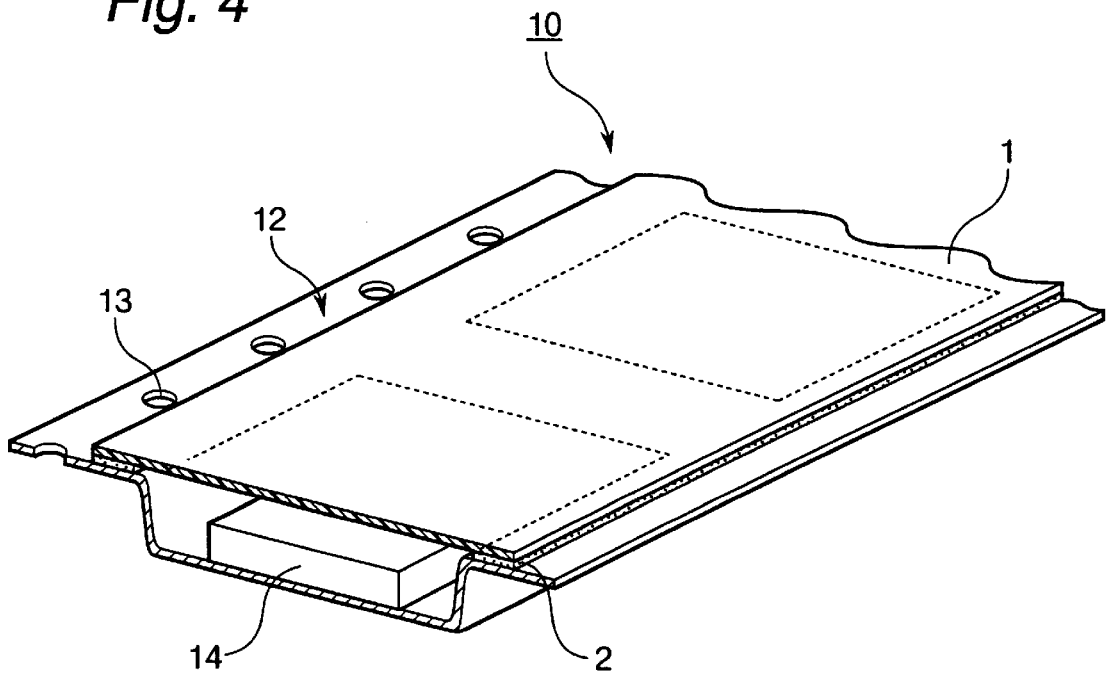
FIG. 4 is a schematic explanatory view of one form of sealed structure of the present invention.
Figure 5:
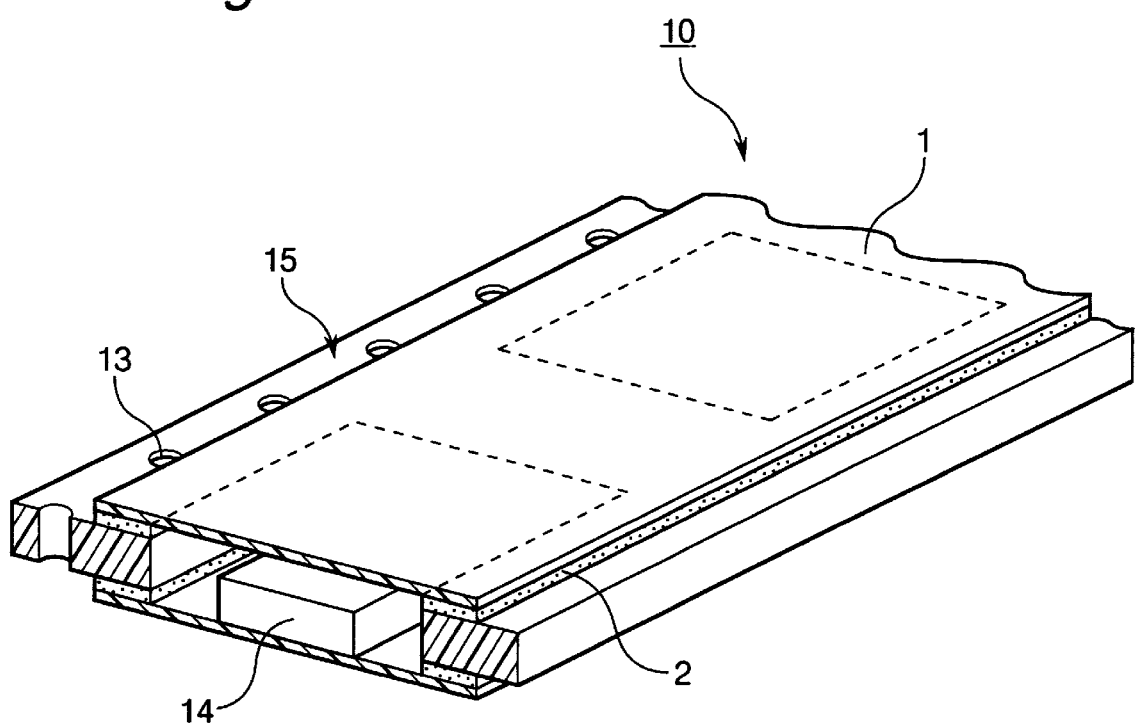
FIG. 5 is a schematic explanatory view of another form of sealed structure of the present invention.

FIGS. 1 to 3 are partial sectional perspective views of some forms of cover tape for chip transportation according to the present invention. FIGS. 4 and 5 show the mode of use of the cover tape with the structure of FIG. 1.

Referring to FIGS. 1 to 3, the cover tape for chip transportation 10 according to the present invention comprises tape-shaped substrate 1 and pressure sensitive adhesive layer 2 superimposed on one surface of the tape-shaped substrate 1 at both edges along the lengthwise direction thereof so that the pressure sensitive adhesive layer 2 is exposed. Specifically, the substrate 1 at both edges along the lengthwise direction thereof may be furnished with strips of the pressure sensitive adhesive layer 2, as shown in FIG. 1. Further, the substrate 1 at both edges along the lengthwise direction thereof may be furnished with strips of the pressure sensitive adhesive layer 2, with non-sticky part 3 interposed between the strips of the pressure sensitive adhesive layer 2, as shown in FIG. 2. Still further, the entire surface of one side of the substrate 1 may be furnished with the pressure sensitive adhesive layer 2, with non-sticky part 3 formed so as to cover the mid portion of the pressure sensitive adhesive layer 2, as shown in FIG. 3. The furnishing of the non-sticky part 3 can be performed by applying a non-sticky resin by coating and converting it into a film or by separately preparing a non-sticky resin film and applying it by lamination.

It is preferred that the tape-shaped substrate 1 be transparent. The use of the transparent substrate facilitates the identification of accommodated chips to thereby enable reducing mounting errors.

Various synthetic resins can be used as the material of the substrate 1. Preferred examples thereof include an oriented polyethylene terephthalate (PET), an oriented polybutylene terephthalate (PBT), polyethylene naphthalate (PEN), an oriented polypropylene (PP), an oriented polyamide, an oriented polyvinyl chloride (PVC), polystyrene (PS), a polycarbonate (PC), polyethylene (PE) and polyacrylonitrile (PAN). Also, laminated films prepared from these can be used as the substrate 1. Of the above polymers, an oriented polyethylene terephthalate (PET), an oriented polybutylene terephthalate (PBT) and polyethylene naphthalate (PEN) are especially preferred in the present invention.

The thickness of the substrate 1 is preferably in the range of 6 to 200 μm, still preferably, 10 to 100 μm.

An antistatic agent may be blended into the substrate 1, or one surface or both surfaces of the substrate 1 may be coated therewith.

In the use of the cover tape provided with no antistatic treatment, the degree of static electricity on peeling at the time of unwinding is so high that, occasionally, the reliability of electronic parts has been damaged. However, the above application of the antistatic treatment enables avoiding the damaging of electronic parts by static electricity.

The pressure sensitive adhesive layer 2 is formed on one surface of the substrate 1. Although the thickness of the pressure sensitive adhesive layer 2 is not particularly limited, it is preferably in the range of, approximately, 5 to 50 μm, still preferably, 10 to 30 μm.

The pressure sensitive adhesive layer 2 comprises a silicone pressure sensitive adhesive and a crosslinking agent (C) capable of crosslinking therewith, the above silicone pressure sensitive adhesive comprising (A) a silicone resin component and (B) a silicone rubber component.

Silicone resins whose structural element is selected from among $R_3SiO_{1/2}$, $R_2SiO$, $RSiO_{3/2}$ and $SiO_2$ units (Rs each independently represent methyl, ethyl, propyl, phenyl or vinyl) are used as the silicone resin component (A) without any particular restriction.

The silicone rubber component (B) has a structure represented by the formula:

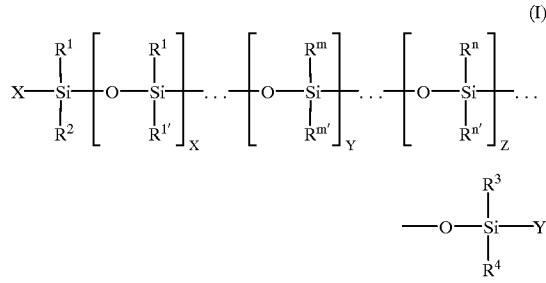

(I)

wherein $R^1$, $R^2$, $R^3$ and $R^4$ may be identical with or different from each other and represent a methyl group, an ethyl group or a propyl group. Of these groups, a methyl group and an ethyl group are preferred.

Either of X and Y represents a hydroxyl group and the other represents a hydroxyl group, hydrogen or an alkyl group having 1 to 13 carbon atoms. The alkyl group is, for example, a methyl group or an ethyl group. When at least one of X and Y is a hydroxyl group, condensation reaction may occur between the silicone resin component (A) and the silicone rubber component (B), or the silicone rubber components (B) may condense with each other.

Each of $R^1$, $R^m$, $R^n$, $R^{1'}$, $R^{m'}$ and $R^{n'}$ independently represents a phenyl group, an alkyl group having 1 to 13 carbon atoms, $CF_3CH_2CH_2-$ or a vinyl group. The alkyl group is, for example, a methyl group, an ethyl group or a propyl group.

At least one of $R^1$, $R^m$, $R^n$, $R^{1'}$, $R^{m'}$ and $R^{n'}$ is a phenyl group. The phenyl group is present in a ratio of 1 to 30 mol %, preferably, 3 to 25 mol % and, still preferably, 5 to 20 mol % per 100 mol % of the sum of $R^1$, $R^m$, $R^n$, $R^{1'}$, $R^{m'}$ and $R^{n'}$. When the amount of phenyl group present in the side chain of the silicone rubber component (B) is less than 1 mol %, the affinity thereof with the silicone resin or long-chain alkyl resin generally used as a release agent is so high that it may occur that there is difficulty in the unwinding of the tape from a wound body. On the other hand, when the amount of phenyl group exceeds 30 mol %, the reactivity between the silicone resin component (A) and the silicone rubber component (B) is lowered, so that it may occur that the pressure sensitive adhesive suffers from cohesive force insufficiency.

Further, it is preferred that at least one of $R^1$, $R^m$, $R^n$, $R^{1'}$, $R^{m'}$ and $R^{n'}$ be a vinyl group. The vinyl group is desirably present in a ratio of 0.01 to 10 mol %, preferably, 0.03 to 5 mol % and, still preferably, 0.05 to 3 mol % per 100 mol % of the sum of $R^1$, $R^m$, $R^n$, $R^{1'}$, $R^{m'}$ and $R^{n'}$. The vinyl group is used when the functional group of the crosslinking agent (C) described below is a hydroxyl group.

In the formula (I), each of x, y and z independently is an integer of 1 to 10, preferably, 2 to 9.

When the silicone rubber component (B) has a vinyl group as its functional group, a silicone component having hydrogen at its both terminals can be used as the crosslinking agent (C), which is the silicone component represented by the formula:

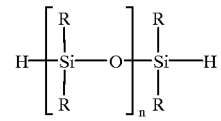

wherein Rs each independently represent a methyl group, an ethyl group or a propyl group, and n is an integer of 3 to 20.

In the use of the above crosslinking agent, the hydrogen conducts an addition reaction with the vinyl group of the silicone rubber component (B) to thereby increase the cohesive force of the pressure sensitive adhesive. The addition reaction may be conducted in the presence of a platinum catalyst in order to increase the reaction rate.

Further, a crosslinked structure can be formed by crosslinking the alkyl groups of the side chains of the silicone resin component (A) and silicone rubber component (B) with each other with the use of a peroxide as the crosslinking agent (C). Examples of suitable peroxides include benzoyl peroxide, di-t-butyl peroxide and dicumyl peroxide. When these peroxides are employed, heating is conducted at relatively high temperatures such as about 120 to 180° C. Therefore, use of a substrate with heat resistance is preferred. The ratio of silicone resin component (A) to silicone rubber component (B) (A/B, weight ratio) is preferably in the range of 70/30 to 30/70, still preferably, 60/40 to 50/50.

The ratio of crosslinking agent (C) to silicone resin component (A) and silicone rubber component (B) (C/A+B, weight ratio) is preferably in the range of 0.01/100 to 10/100, still preferably, 0.1/100 to 5/100.

The silicone pressure sensitive adhesive can be produced by the method in which the silicone resin component (A) and the silicone rubber component (B) as principal ingredients are simply blended together or the method in which a dehydration condensation is conducted between the terminal hydroxyl group (OH) of the silicone rubber and the hydroxyl group of the silicone resin in the presence of a condensation catalyst. In the former method, it may occur that the cohesive force at high temperatures is poor. However, in the latter method, the cohesive force can be increased by the dehydration condensation.

The pressure sensitive adhesive layer 2 is formed by coating the substrate 1 with a coating liquid for pressure sensitive adhesive formation which contains the silicone pressure sensitive adhesive comprising the above components (A) and (B) and the crosslinking agent (C) and, thereafter, heating the coated substrate for a short period of time.

This heating is performed at temperature preferably ranging from 60 to 180° C., still preferably, 80 to 130° C. and, especially preferably, 90 to 120° C. for a duration which, depending on the heating temperature, generally ranges from about 0.5 to 3 min, preferably, 1 to 2 min.

The probe tack energy value of the above pressure sensitive adhesive layer 2 is preferably in the range of $2.0 \times 10^{-3}$ to $1.0 \times 10^{-1}$ N·m, still preferably, $3.0 \times 10^{-3}$ to $5.0 \times 10^{-2}$ N·m and, especially preferably, $5.0 \times 10^{-3}$ to $3.0 \times 10^{-2}$ N·m.

The probe tack energy value was determined in the following manner. With the use of a device capable of measuring the change with the passage of time of the load applied to probe in the probe tack tester stipulated in ASTM D 2979, the probe and a test specimen were peeled from each other at a fixed rate to thereby obtain a load curve. The area enclosed by the load curve and the time axis (namely, distance axis) was measured as the probe tack energy value.

When the probe tack energy value is less than $2.0 \times 10^{-3}$ N·m, the adhesive strength between the pressure sensitive adhesive and the carrier tape is unsatisfactory, and lifting/separation (wrinkle) may be likely to occur during the storage at high temperatures. On the other hand, when the probe tack energy value exceeds $1.0 \times 10^{-1}$ N·m, adhesive residue may occur on the carrier tape after the separation of the cover tape.

Moreover, the pressure sensitive adhesive layer 2 of the present invention may comprise, according to necessity, a tackifier resin, a pigment, a dye, an antifoaming agent, an antiseptic, etc. in an amount not detrimental to the objective of the present invention in order to regulate the adhesive strength, cohesive force, tack, molecular weight, molecular weight distribution, elastic modulus, glass transition temperature, etc. of the pressure sensitive adhesive. These other components are preferably used in an amount of about 0.01 to 20 parts by weight per 100 parts by weight of silicone pressure sensitive adhesive as a principal component, although varied depending on the object of each particular component.

In the cover tape for chip transportation according to the present invention, one surface of the substrate 1 (surface not furnished with the pressure sensitive adhesive layer 2) may be furnished with a release layer. The release layer is composed of a dimethylsiloxane, fluorosiloxane or other fluorinated resin or a long-chain alkyl resin. Generally, a dimethylsiloxane or long-chain alkyl release agent is used because a fluorosiloxane release agent is expensive. When the dimethylsiloxane release agent is employed, it has been difficult to utilize the conventional silicone pressure sensitive adhesive. The reason is presumed to be that the compositions of the release agent and the pressure sensitive adhesive are close to each other, thereby causing strong adherence therebetween. However, in the present invention, the introduction of a phenyl group into the side chain of the silicone pressure sensitive adhesive has enabled employing an inexpensive and easily workable dimethylsiloxane release agent in combination with the silicone pressure sensitive adhesive.

Furthermore, the substrate 1 and the release layer may be provided with an antistatic treatment. This is carried out by a coating of an antistatic agent comprising carbon, a metal, a metal oxide, a cation, an anion, a nonion, an organopolymeric conductor or the like. Also, one surface of the substrate may be treated with corona in order to increase the bonding between the substrate and the pressure sensitive adhesive.

The cover tape for chip transportation according to the present invention can be produced by, for example, the following procedure.

In the production of the tape having the structure of FIG. 1, first, a surface of the substrate 1 is subjected to release treatment by the use of, for example, a roll coater or a gravure coater. Then, the opposite surface of the substrate 1 at both edges along the lengthwise direction thereof is furnished with pressure sensitive adhesive layers 2 by coating with the use of, for example, a roll coater or a knife coater. Alternatively, the cover tape for chip transportation according to the present invention can be produced by applying a plurality of pressure sensitive adhesive strips along the lengthwise direction of a sheet with relatively large width by coating and, thereafter, cutting the pressure sensitive adhesive strips along the center line of the adhesive strips and along the lengthwise direction of the sheet.

In the production of the tape with the structure of FIG. 2, this can be attained by applying a non-sticky resin by coating simultaneously with the application of the pressure sensitive adhesive layers 2 and drying the applied non-sticky resin.

In the production of the tape with the structure of FIG. 3, this can be attained by forming pressure sensitive adhesive layer 2 on the entire surface of the tape opposite to the surface provided with the release treatment and, thereafter, either coating the surface of the pressure sensitive adhesive layer corresponding to the mid portion of the tape with a non-sticky resin, followed by drying, or laminating the tape with a separately prepared non-sticky resin film.

Even when a polystyrene carrier tape is used, the above cover tape for chip transportation 10 according to the present invention effectively adheres to the carrier tape, so that the unfavorable separation of the cover tape from the carrier tape which is attributed to a difference in thermal shrinkage ratio can be avoided. Further, when a carrier tape with relatively high polarity, such as a polycarbonate, a polyvinyl chloride or an amorphous polyethylene terephthalate tape is used, the adhesive residue on the carrier tape can be avoided.

The cover tape for chip transportation according to the present invention can be used as, for example, a sealed structure without any particular modification to the conventional tape carrier system.

In the system using a substrate furnished with recessed parts as a carrier tape (see FIG. 4), a sealed structure having a multiplicity of electronic parts accommodated therein can be obtained by providing carrier tape 12 which comprises a plastic tape furnished with a multiplicity of recessed parts at fixed intervals to thereby form accommodating parts and also furnished with feeding holes 13, subsequently accommodating chips 14 such as small electronic parts in the accommodating parts and thereafter conducting a lamination sealing with the cover tape 10.

In the system using a carrier tape furnished with through holes (see FIG. 5), a sealed structure can be obtained by providing carrier tape 15 of, for example, thick strip paper furnished with a multiplicity of through holes at fixed intervals by, for example, punching to thereby form accommodating parts and separately furnished with a multiplicity of feeding holes 13, next attaching a bottom tape to one side of the carrier tape 15, subsequently accommodating chips 14 such as small electronic parts in the accommodating parts and thereafter laminating the other side of the carrier tape 15 with the cover tape 10 to thereby seal the chips.

The foregoing describes the cover tape for chip transportation and sealed structure according to the present invention, which, however, in no way limits the scope of the invention. Partial modification, addition, etc. can be made, which are also comprehended in the present invention. For example, the material of the substrate is not limited to the species described above and can be varied so far as the variation is not detrimental to the object of the present invention. Further, the chips accommodated in the accommodating parts of the carrier tape are not limited to small electronic parts and may be small mechanical parts, tablets, etc.

As apparent from the foregoing, the present invention enables not only avoiding the lifting/separation of the cover tape from the carrier tape during the transportation at high temperatures but also avoiding the adhesive residue on the carrier tape. Therefore, the present invention provides the sealed structure which enables stably transporting a large number of electronic parts. Moreover, in the present invention, small unwinding force is ensured irrespective of the type of release agent to thereby enable reducing the load on sealing apparatus and efficiently performing sealing operation.

EXAMPLE

The present invention will now be illustrated in greater detail with reference to the following Examples, which in no way limit the scope of the invention. In the following Examples and Comparative Examples, the "tape lifting", "adhesive residue", "adhesive strength", "probe tack energy value", "peeling strength" and "tape unwinding property" were evaluated in the following manner.

"Tape lifting"

The cover tape for chip transportation obtained in each of the Examples and Comparative Examples was stuck to a carrier tape of polystyrene and allowed to stand still in an atmosphere of 70° C. for 24 hr. Thereafter, the presence of any lifting of cover tape was visually inspected.

"Adhesive residue"

After the evaluation of the above "tape lifting", the cover tape was peeled from the carrier tape. The presence of any adhesive residue on the polystyrene carrier tape was visually inspected.

"Adhesive strength"

The cover tape obtained in each of the Examples and Comparative Examples was wound to thereby obtain a wound body. Then, the cover tape was stuck to each carrier tape and allowed to stand still in an atmosphere of 23° C. and 65% RH for 20 min. Thereafter, the adhesive strength was measured by the use of a universal tensile tester at a peeling speed of 300 mm/min and a peeling angle of 180°.

"Probe tack energy value"

The probe tack energy value was measured with the use of a device capable of measuring the change with the passage of time of the load applied to probe in the probe tack tester stipulated in ASTM D 2979. Test specimen (10 mm×10 mm) was caused to contact probe having a diameter of 5 mm for 60 sec and peeled therefrom at a rate of 1 mm/min to thereby obtain a load curve. The area enclosed by the load curve and the time axis (namely, distance axis) was measured as the probe tack energy value.

"Peeling strength"

With respect to a 25 mm wide laminate obtained by laminating a pressure sensitive adhesive sheet composed of substrate and pressure sensitive adhesive with a release sheet composed of substrate and release agent for use in each of the Examples and Comparative Examples, the peeling strength was measured by the use of a universal tensile tester at a peeling speed of 300 mm/min and a peeling angle of 180°.

"Tape unwinding property"

With respect to the wound body of cover tape obtained in each of the Examples and Comparative Examples, the tape unwinding was performed by the use of sealing apparatus (ETM-104 manufactured by Shibuya Kogyo K.K.). The evaluation mark "A" was given when the tape unwinding performed with no problem, and the evaluation mark "B" was given when the tape unwinding could not be performed.

Example 1

[Preparation of coating liquid for formation of silicone pressure sensitive adhesive]

59 parts by weight of silicone resin consisting of $(CH_3)_3SiO_{1/2}$ units and $SiO_2$ units at a ratio of $[(CH_3)_3SiO_{1/2}]/[SiO_2]$ of 0.7 as a silicone resin component was mixed with 41 parts by weight of silicone rubber (phenyl group content: 15 mol %, vinyl group content: 0.1 mol %, terminal hydroxyl group content: 0.001 mol % and terminal hydrogen content: 0.001 mol %) as a silicone rubber component in a toluene/xylene solvent at 125° C., and a condensation reaction between the terminal hydroxyl group of the silicone resin and the terminal hydroxyl group of the silicone rubber was performed in the presence of NaOH catalyst. Thus, a silicone pressure sensitive adhesive was synthesized.

Subsequently, 0.5 part by weight of silicone crosslinking agent containing a platinum catalyst and having hydrogen at both terminals thereof (XC90-B0368 produced by Toshiba Silicone Co., Ltd.) was added to the silicone pressure sensitive adhesive.

[Production of cover tape for chip transportation]

Dimethylsiloxane release treatment was applied to one surface of a 25 μm thick polyethylene terephthalate (PET) film, and the opposite surface thereof was coated with the above prepared coating liquid so that the thickness of the coating after drying was 30 μm. The width of part coated with the pressure sensitive adhesive was 1 mm, and the width of part uncoated with the pressure sensitive adhesive was 7.3 mm. The coated film was heated at 120° C. for 1 min and cut into a width of 9.3 mm so that both edges thereof had 1 mm wide pressure sensitive adhesive coated parts. Thus, the cover tape for chip transportation shown in FIG. 1 was obtained.

The adhesive strength of the thus obtained cover tape to each of various adherends was measured. The results are given in Table 1.

Further, the "tape lifting", "adhesive residue" and "probe tack energy value" were evaluated in the above manner. The results are given in Table 2.

With respect to the "peeling strength" and "tape unwinding property", the evaluation results are given in Table 3.

Comparative Example 1

The same operation and evaluation as in Example 1 were performed except that an acrylic pressure sensitive adhesive (based on butyl acrylate/hydroxyethyl acrylate copolymer) was used in place of the silicone pressure sensitive adhesive. The results are given in Tables 1 to 3.

Example 2

A cover tape was obtained in the same manner as in Example 1, except that a long-chain alkyl release treatment was used in place of the dimethylsiloxane release treatment. The evaluation results on the "peeling strength" and "tape unwinding property" are given in Table 3.

Comparative Example 2

A cover tape was obtained in the same manner as in Comparative Example 1, except that a long-chain alkyl release treatment was used in place of the dimethylsiloxane release treatment. The evaluation results on the "peeling strength" and "tape unwinding property" are given in Table 3.

Comparative Example 3

A cover tape was obtained in the same manner as in Comparative Example 1, except that a polydimethylsiloxane silicone pressure sensitive adhesive was used in place of the acrylic pressure sensitive adhesive. The evaluation results on the "peeling strength" and "tape unwinding property" are given in Table 3.

Comparative Example 4

A cover tape was obtained in the same manner as in Comparative Example 2, except that a polydimethylsiloxane silicone pressure sensitive adhesive was used in place of the acrylic pressure sensitive adhesive. The evaluation results on the "peeling strength" and "tape unwinding property" are given in Table 3.

TABLE 1

Adhesive Strength (g) to Adherends

| | Adherend | | | | |
|---|---|---|---|---|---|
| | PS | PVC | A-PET | PC | PP |
| Example 1 | 45 | 42 | 44 | 47 | 44 |
| Compar. Example 1 | 30 | 88 | 5 | 95 | 5 |

PS: polystyrene (surface tension: 35 dyn/cm)
PVC: polyvinyl chloride (surface tension: 45 dyn/cm)
A-PET: amorphous polyethylene terephthalate (surface tension: 40 dyn/cm)
PC: polycarbonate (surface tension: 40 dyn/cm)
PP: polypropylene (surface tension: 33 dyn/cm)

TABLE 2

| | Probe tack energy value (N · m) | Lifting of cover tape (present or absent) | Adhesive residue (present or absent) |
|---|---|---|---|
| Example 1 | $7.8 \times 10^{-3}$ | Absent | Absent |
| Comparat. Example 1 | $1.5 \times 10^{-3}$ | Present | Absent |

TABLE 3

| | Peeling strength (g/25 mm) | Tape unwinding property |
|---|---|---|
| Example 1 | 10 | A |
| Example 2 | 130 | A |
| Comparat. Example 1 | 5 | A |
| Comparat. Example 2 | 320 | B |
| Comparat. Example 3 | 500 or greater | B |
| Comparat. Example 4 | 500 or greater | B |

What is claimed is:

1. A cover tape for chip transportation stuck to a surface of a carrier tape which has parts for accommodating chips formed intermittently in its lengthwise direction, to thereby seal the chip accommodating parts, wherein said cover tape comprises a tape-shaped substrate and pressure sensitive adhesive parts superimposed on one surface of the tape-shaped substrate so that the pressure sensitive adhesive parts do not face the chip accommodating parts, said pressure sensitive adhesive parts comprising a silicone pressure sensitive adhesive and a crosslinking agent (C) capable of crosslinking therewith,
said silicone pressure sensitive adhesive comprising:
(A) a silicone resin component and
(B) a silicone rubber component with a structure represented by the formula:

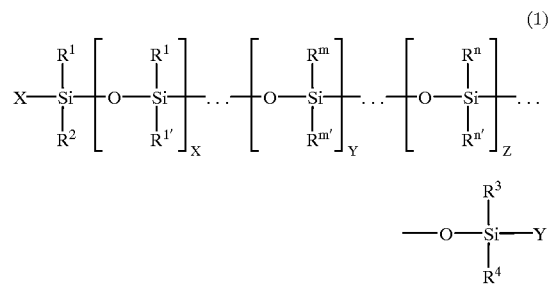

(1)

wherein $R^1$, $R^2$, $R^3$ and $R^4$ may be identical with or different from each other and represent a methyl group, an ethyl group or a propyl group;
either of X and Y represents a hydroxyl group and the other represents a hydroxyl group, hydrogen or an alkyl group having 1 to 13 carbon atoms;
each of $R^1$, $R^m$, $R^n$, $R^{1'}$, $R^{m'}$ and $R^{n'}$ independently represents a phenyl group, an alkyl group having 1 to 13 carbon atoms, $CF_3CH_2CH_2$— or a vinyl group, provided that at least one of $R^1$, $R^m$, $R^n$, $R^{1'}$, $R^{m'}$ and $R^{n'}$ is a phenyl group which is present in a ratio of 1 to 30 mol % per 100 mol % of the sum of $R^1$, $R^m$, $R^n$, $R^{1'}$, $R^{m'}$ and $R^{n'}$; and each of x, y and z independently is an integer of 1 to 10.

2. The cover tape for chip transportation as claimed in claim 1, wherein the pressure sensitive adhesive parts exhibit a probe tack energy value of $2.0 \times 10^{-3}$ to $1.0 \times 10^{-1}$ N·m.

3. The cover tape for chip transportation as claimed in claim 1, wherein a substrate surface not furnished with the pressure sensitive adhesive parts is furnished with a release agent layer.

4. A sealed structure comprising:
a carrier tape having a plurality of parts for accommodating chips formed intermittently in its lengthwise direction,
a plurality of chips accommodated in the chip accommodating parts, and
a cover tape for chip transportation capable of sealing the chip accommodating parts,
wherein, said cover tape for chip transportation being one claimed in claim 1.

5. The cover tape for chip transportation as claimed in claim 2, wherein a substrate surface not furnished with the pressure sensitive adhesive parts is furnished with a release agent layer.

6. A sealed structure comprising:
a carrier tape having a plurality of parts for accommodating chips formed intermittently in its lengthwise direction,
a plurality of chips accommodated in the chip accommodating parts, and a cover tape for chip transportation capable of sealing the chip accommodating parts, wherein, said cover tape for chip transportation being one claimed in claim 2.

7. A sealed structure comprising:

a carrier tape having a plurality of parts for accommodating chips formed intermittently in its lengthwise direction, a plurality of chips accommodated in the chip accommodating parts, and a cover tape for chip transportation capable of sealing the chip accommodating parts, wherein, said cover tape for chip transportation being one claimed in claim 3.

8. A sealed structure comprising:

a carrier tape having a plurality of parts for accommodating chips formed intermittently in its lengthwise direction, a plurality of chips accommodated in the chip accommodating parts, and a cover tape for chip transportation capable of sealing the chip accommodating parts, wherein, said cover tape for chip transportation being one claimed in claim 5.

* * * * *